(12) United States Patent
Dornel et al.

(10) Patent No.: US 8,928,051 B2
(45) Date of Patent: Jan. 6, 2015

(54) METAL OXIDE SEMICONDUCTOR (MOS) DEVICE WITH LOCALLY THICKENED GATE OXIDE

(71) Applicants: International Business Machines Corporation, Armonk, NY (US); STMicroelectronics S.A., Montrouge (FR)

(72) Inventors: Erwan Dornel, Fontaine (FR); Pascal R. Tannhof, Fontainebleau (FR); Denis Rideau, Grenoble (FR)

(73) Assignees: International Business Machines Corporation, Armonk, NY (US); STMicroelectronics S.A., Montrouge (FR)

( * ) Notice: Subject to any disclaimer, the term of this patent is extended or adjusted under 35 U.S.C. 154(b) by 0 days.

(21) Appl. No.: 14/084,803

(22) Filed: Nov. 20, 2013

(65) Prior Publication Data

US 2014/0070331 A1 Mar. 13, 2014

Related U.S. Application Data

(62) Division of application No. 13/474,803, filed on May 18, 2012, now Pat. No. 8,741,704.

(30) Foreign Application Priority Data

Mar. 8, 2012 (EP) .................................... 12305276

(51) Int. Cl.

| | |
|---|---|
| *H01L 29/40* | (2006.01) |
| *H01L 21/28* | (2006.01) |
| *H01L 29/423* | (2006.01) |
| *H01L 29/51* | (2006.01) |
| *H01L 29/66* | (2006.01) |
| *H01L 29/78* | (2006.01) |

(52) U.S. Cl.

CPC ........ *H01L 29/401* (2013.01); *H01L 21/28247* (2013.01); *H01L 29/42368* (2013.01); *H01L 29/512* (2013.01); *H01L 29/6659* (2013.01); *H01L 29/51* (2013.01); *H01L 29/7833* (2013.01); *H01L 29/517* (2013.01)

USPC .......................................................... 257/288

(58) Field of Classification Search

CPC ..................................................... H01L 29/401
USPC ........................... 257/288; 438/197, 299, 163
See application file for complete search history.

(56) References Cited

U.S. PATENT DOCUMENTS

| | | | |
|---|---|---|---|
| 4,885,259 A | 12/1989 | Osinski et al. | |
| 5,306,655 A | * 4/1994 | Kurimoto | ...................... 438/302 |

(Continued)

OTHER PUBLICATIONS

Ballan H., "High-Voltage CMOS and Scaling Trends", Electrochemical Society, vol. 2003-06, p. 288, Copyright 2003, www.advancedsilicon.com.

(Continued)

*Primary Examiner* — Nathan Ha

(74) *Attorney, Agent, or Firm* — Scully, Scott, Murphy & Presser, P.C.; Yuanmin Cai

(57) ABSTRACT

A method of fabricating a semiconductor device including providing a gate structure on a channel portion of a semiconductor substrate, wherein the gate structure includes at least one gate dielectric on the channel portion of the semiconductor substrate and at least one gate conductor on the at least one gate dielectric. An edge portion of the at least one gate dielectric is removed on each side of the gate structure, wherein the removing of the edge portion of the gate dielectric provides an exposed base edge of the at least one gate conductor and an exposed channel surface of the semiconductor substrate underlying the gate structure. The sidewall of the gate structure is oxidized, which also oxidizes at least one of the exposed base edge of the at least one gate conductor and the exposed channel surface of the semiconductor substrate that is underlying the gate structure.

15 Claims, 5 Drawing Sheets

(56) References Cited

U.S. PATENT DOCUMENTS

| | | |
|---|---|---|
| 5,382,533 A | 1/1995 | Ahmad et al. |
| 5,637,514 A | 6/1997 | Jeng et al. |
| 5,714,413 A | 2/1998 | Brigham et al. |
| 5,858,844 A | 1/1999 | Fang et al. |
| 6,015,736 A | 1/2000 | Luning et al. |
| 6,255,183 B1 | 7/2001 | Schmitz et al. |
| 6,281,079 B1 | 8/2001 | Heineck et al. |
| 6,352,885 B1 | 3/2002 | Wieczorek et al. |
| 6,509,219 B2 | 1/2003 | Tsou et al. |
| 6,541,362 B2 | 4/2003 | Forbes et al. |
| 6,544,845 B2 | 4/2003 | Yoo et al. |
| 6,548,363 B1 | 4/2003 | Wu et al. |
| 6,566,210 B2 | 5/2003 | Dokumaci et al. |
| 6,614,081 B2 | 9/2003 | Makabe et al. |
| 6,740,944 B1 | 5/2004 | McElheny et al. |
| 6,858,907 B2 | 2/2005 | Ryu et al. |
| 7,012,313 B2 | 3/2006 | Heineck et al. |
| 7,875,517 B2 | 1/2011 | Cai |
| 7,985,649 B1 | 7/2011 | Winstead et al. |
| 2010/0072545 A1 | 3/2010 | Ryu et al. |

OTHER PUBLICATIONS

United States Official Action dated Oct. 2, 2013 from related U.S. Appl. No. 13/474,803.

* cited by examiner

METAL OXIDE SEMICONDUCTOR (MOS) DEVICE WITH LOCALLY THICKENED GATE OXIDE

CROSS REFERENCE TO RELATED APPLICATION

This application is a divisional of U.S. patent application Ser. No. 13/474,803, filed on May 18, 2012, the entire content and disclosure of which are incorporated herein by reference.

BACKGROUND

The present disclosure relates generally to semiconductor devices. More particularly, the present disclosure relates to scaling of semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

SUMMARY

A method of fabricating a semiconductor device is provided that, in one embodiment, includes providing a gate structure on a channel portion of a semiconductor substrate, wherein the gate structure includes at least one gate dielectric on the channel portion of the semiconductor substrate and at least one gate conductor on the at least one gate dielectric. An edge portion of the at least one gate dielectric is removed from each side of the gate structure. Removing the edge portion of the gate dielectric provides an exposed base edge of the at least one gate conductor and an exposed channel surface of the semiconductor substrate underlying the gate structure. The sidewall of the gate structure is oxidized. The oxidizing of the sidewall of the gate structure also oxidizes at least one of the exposed base edges of the at least one gate conductor and the exposed channel surface of the semiconductor substrate that is underlying the gate structure.

In another aspect, a semiconductor device is provided that includes a gate structure on a semiconductor substrate, in which the gate structure includes at least one gate conductor and at least one gate dielectric. The at least one gate dielectric includes a dielectric layer that is in direct contact with a surface of the semiconductor substrate, in which edge portions of the dielectric layer have a greater thickness than a central portion of the dielectric layer. The lower surface of the edge portion of the dielectric layer extends into the semiconductor substrate. The gate conductor is present on an upper surface of the edge portions.

In another aspect, a method of fabricating a semiconductor device is provided that in one embodiment includes providing a gate structure on a channel portion of a semiconductor substrate, wherein the gate structure includes at least one gate dielectric on the channel portion of the semiconductor substrate and at least one gate conductor on the at least one gate dielectric. An edge portion of the at least one gate dielectric is removed on each side of the gate structure, wherein the removing of the edge portion of the at least one gate dielectric provides an exposed base edge of the at least one gate conductor and an exposed channel surface of the semiconductor substrate underlying the gate structure. A sidewall of the gate structure is nitrided, wherein the nitriding of the sidewall of the gate structure also nitrides at least one of the exposed base edge of the at least one gate conductor and the exposed channel surface of the semiconductor substrate that is underlying the gate structure.

DESCRIPTION OF SEVERAL VIEWS OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Figure 1:
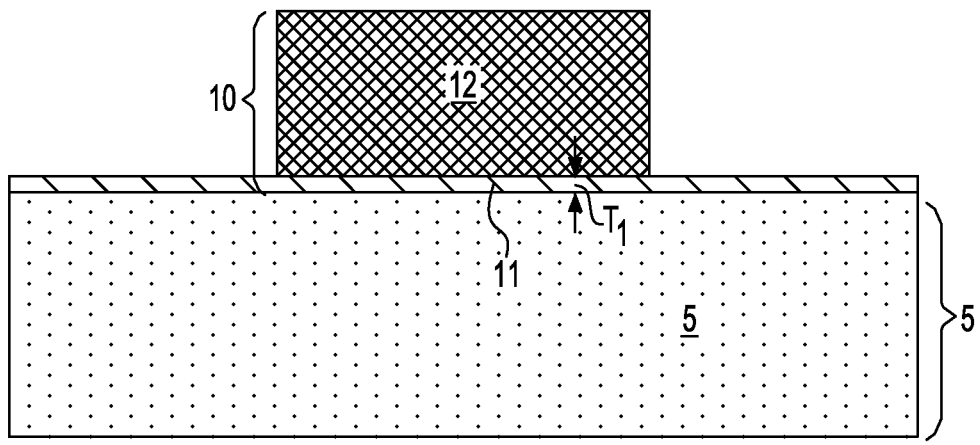
FIG. 1 is a side cross-sectional view depicting forming a gate structure on a semiconductor substrate, in which the gate structure includes at least one gate conductor on at least one gate dielectric, as used in one embodiment of a method of forming a semiconductor device in accordance with the present disclosure.

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. References in the specification to "one embodiment", "an embodiment", "an example embodiment", etc., indicate that the embodiment described may include a particular feature, structure, or characteristic, but every embodiment may not necessarily include the particular feature, structure, or characteristic.

Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "top", "bottom", and derivatives thereof shall relate to the disclosed structures, as they are oriented in the drawing figures. The terms "overlying", or "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is related to a method for fabricating high voltage metal oxide semiconductor (HVMOS) devices, which exhibit high electric fields through the gate dielectric. By "high voltage" it is meant a voltage within the range of 3 V to 30 V. As used herein, a high electric field is an electric field within a range of $2 \times 10^6$ V·cm$^{-1}$ to $14 \times 10^6$ V·cm$^{-1}$. In some instances, one advantage of HVMOS devices over low power devices is the possibility to operate at a high drain voltage (Vd) and high gate voltage (Vg).

The performance of HVMOS devices at high drain voltage (Vd) may be reduced by gate induced drain leakage (GIDL) at null gate voltage (Vg), i.e., leakage assisted by high drain-gate field. In some instances, gate induced drain leakage may reduce the range of operation of the HVMOS device. Further, at a medium gate voltage (Vg) in HVMOS devices, which is typically the Vdd/2 (the Vdd is the positive supply voltage), HVMOS devices may exhibit hot carrier injection and drain avalanche hot carrier effects. This mechanism in which carriers are injected through the gate dielectric is known to be a cause of gate dielectric damage, which lowers the reliability of the device.

In some embodiments, the methods and structures disclosed herein overcome the above noted disadvantages with an etch that is applied to the base of the gate structure following patterning of the gate structure and before oxidation of the sidewall of the gate structure. The etch process that is applied to the base of the gate structure removes a portion of the gate dielectric, e.g., gate oxide, from the corner of the gate structure. Because a portion of the gate dielectric is removed from the corner of the gate structure, the edges of the gate electrode and the channel portion of the semiconductor device are exposed. Therefore, at least a portion of the edges of the gate electrode and the channel portion of the semiconductor device are consumed during the oxidation process that oxidizes the sidewalls of the gate structure. The final semiconductor device formed using this process has a thicker gate dielectric, e.g., gate oxide, at the corner of the gate structure than at a central portion of the gate dielectric. In some embodiments, the thicker gate dielectric at the corner of the gate structure reduces gate induced drain leakage and hot carrier injection/drain avalanche hot carrier effects. Some embodiments of forming a gate structure including a gate dielectric with thicker portions at the corner of the gate structure than a central portion of the gate structure are now described with reference to FIGS. 1-10.

FIGS. 1-5 depict one embodiment of forming a semiconductor device 100 including at least one gate dielectric 11 with edge portions 15, i.e., portions adjacent to the sidewall of the gate structure 10, that have a greater thickness than the central portions of the gate structure 10, in which source extension region 13 and the drain extension region 14 of the device are formed prior to an oxidation process that is applied to the gate structure 10. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. In some embodiments, the semiconductor devices disclosed herein are high voltage metal oxide semiconductor (HVMOS) devices. A high voltage metal oxide semiconductor device is a semiconductor device that may operate at voltages ranging from 3 volts to 30 volts.

FIG. 1 depicts one embodiment of forming a gate structure 10 on a semiconductor substrate 5, in which the gate structure 10 includes at least one gate conductor 12 on at least one gate dielectric 11. The semiconductor substrate 5 may be composed of a silicon containing material. Si-containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate 5 is not limited to only silicon containing materials, as the semiconductor substrate 5 may be composed of any semiconducting material, such as compound semiconductors including GaAs, InAs and other like semiconductors. In the example, that is depicted in FIG. 1, the semiconductor substrate 5 is a bulk-semiconductor substrate. Although not depicted in FIG. 1, the semiconductor substrate 5 may include layered semiconductors, such as Si/Ge and Silicon-On-Insulators. The semiconductor substrate 5 may include a doped region, which may also be referred to as a well. A doped region is formed in the semiconductor substrate 5 by adding dopant atoms to an intrinsic semiconductor, which changes the electron and hole carrier concentrations of the intrinsic semiconductor at thermal equilibrium. The doped region may be p-type or n-type. In one embodiment, the semiconductor substrate 5 is composed of a single crystal material, such as single crystal silicon. As used herein, the term "single crystal" denotes a crystalline solid, in which the crystal lattice of the entire sample is substantially continuous and substantially unbroken to the edges of the sample, with substantially no grain boundaries.

The gate structure 10 may be formed using deposition, photolithography and etch processes. The term "gate structure" means a structure used to control output current (i.e., flow of carriers in the channel) of a semiconducting device through electrical or magnetic fields. For example, the material layers for the at least one gate dielectric 11 and the at least one gate electrode 12 may be deposited onto the semiconductor substrate 5 to provide a gate stack. Thereafter, the gate stack may be patterned and etched to provide the gate structure 10. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections of the sacrificial material covered by the photoresist are protected to provide the gate structure 10, while the exposed regions are removed using a selective etching process that removes the unprotected regions. Following formation of the gate structure 10 the photoresist may be removed.

The at least one gate dielectric 11 may be composed of any dielectric material including oxides, nitrides and oxynitrides. In one embodiment, the at least one gate dielectric 11 may be provided by a high-k dielectric material. The term "high-k" as used to describe the material of the at least one gate dielectric 11 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In an even further example, the dielectric constant of the high-k dielectric material may be greater than 10.0. In one embodiment, the at least one gate dielectric 11 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric 11 include hafnium silicate, hafnium silicon oxynitride or combinations thereof. In one embodiment, the at least one gate dielectric 11 may be deposited by chemical vapor deposition (CVD). Variations of CVD processes suitable for depositing the at least one gate dielectric 11 include, but are not limited to, Atmospheric Pressure CVD (APCVD), Low Pressure CVD (LPCVD), Plasma Enhanced CVD (EPCVD), Metal-Organic CVD (MOCVD) and combinations thereof. The at least one gate dielectric 11 may also be formed using in situ steam generation (ISSG). In one embodiment, the thickness T1 of the at least one gate dielectric 11 is greater than 0.8 nm. More typically, the at least one gate dielectric 11 has a thickness T1 ranging from about 1.0 nm to about 6.0 nm. In the embodiment that is depicted in FIG. 1, the at least one gate dielectric 11 is composed of a single dielectric layer. Applicants submit that the present disclosure is not limited to only this embodiment, as any number of dielectric layers may be present in the at least one gate dielectric 11, so long as at least one of the dielectric layers may be etched to expose at least a portion of the semiconductor substrate 5, and in some instances expose at least a portion of the semiconductor substrate 5 and a portion of the at least one gate conductor 12.

In one embodiment, the at least one gate conductor 12 is composed of metal or a doped semiconductor that can be oxidized. One example of a doped semiconductor that is suitable for the at least one gate conductor 12 is doped polysilicon, such as n-type doped polysilicon. Examples of metals that may be employed for the at least one gate conductor 12 may include, but are not limited to, W, Ni, Ti, Mo, Ta, Cu, Pt, Ag, Au, Ru, Ir, Rh, La and Re, and alloys thereof. The metal that provides the at least one gate conductor may also include nitrides, such as TiN. The at least one gate conductor 12 may be formed by a deposition process, such as CVD, plasma-assisted CVD, plating, and/or sputtering, followed by planarization. The at least one gate conductor 12 may be a multi-layered structure. When a combination of conductive elements is employed, an optional diffusion barrier material such as TaN or WN may be formed between the conductive materials.

In some embodiments, a dielectric gate cap (not shown) may be present on the upper surface of the at least one gate conductor 12. The dielectric gate cap may be composed of any dielectric material, such as an oxide, nitride or oxynitride material. In one example, the dielectric gate cap is composed of silicon nitride. The dielectric gate cap is optional and may be omitted.

Figure 2:
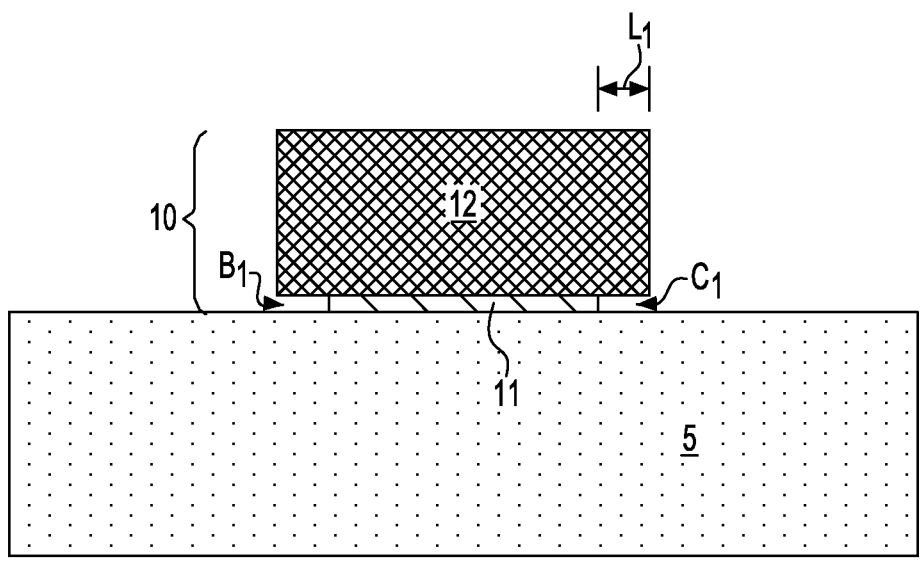
FIG. 2 is a side cross-sectional view depicting removing an edge portion of the at least one gate dielectric from each side of the gate structure, wherein removing the edge portion of the at least one gate dielectric exposes a base edge of the at least one gate conductor and a channel surface of the semiconductor substrate that is underlying the gate structure, in accordance with the present disclosure.

FIG. 2 depicts removing an edge portion of the at least one gate dielectric 11 from each side of the gate structure 10, wherein removing the edge portion of the at least one gate dielectric 11 exposes a base edge B1 of the at least one gate conductor 12 and a channel surface C1 of the semiconductor substrate 5 that is underlying the gate structure 10. In one embodiment, the edge portion of the at least one gate dielectric 11 is removed by an etch process, such as a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater. In one embodiment, the etch process is an isotropic etch. The term "isotropic" denotes an etch that is non-directional. In contrast to an isotropic etch, an anisotropic etch is an etch process is a material removal process in which the etch rate in the direction normal to the surface to be etched is greater than in the direction parallel to the surface to be etched. In one embodiment, the selective etch for removing the edge portions of the at least one gate dielectric 11 removes the material of the at least one gate dielectric 11 selectively to the semiconductor substrate 5 and the at least one gate conductor 12. For example and in one embodiment in which the at least one gate dielectric 11 is comprised of silicon oxide ($SiO_2$), the at least one gate conductor 12 is comprised of polysilicon, and the semiconductor substrate 5 is comprised of silicon, e.g., single crystal silicon (Si), the etch process for removing the edge portions of the at least one gate dielectric 11 removes silicon oxide selectively to polysilicon and silicon.

The etch process for removing the edge portions of the at least one gate dielectric 11 may be referred to as a gate oxide side etch (GOSE), which may include an HF chemical solution. Other chemistries for removing the edge portions of the at least one gate dielectric 11 include hydrofluoric acid (HF), a buffered oxide etch (BOE), a mixture of HF and ammonium fluoride or a combination thereof. In one embodiment, each edge portion of the at least one gate dielectric 11 that is removed has a length L1 that ranges from 2 nm to 25 nm, as measured from a sidewall of the at least one gate conductor 12 of the gate structure 10. In another embodiment, each edge portion of the at least one gate dielectric 11 that is removed has a length L1 that ranges from 5 nm to 10 nm, as measured from a sidewall of the at least one gate conductor 12 of the gate structure 10.

Figure 3:
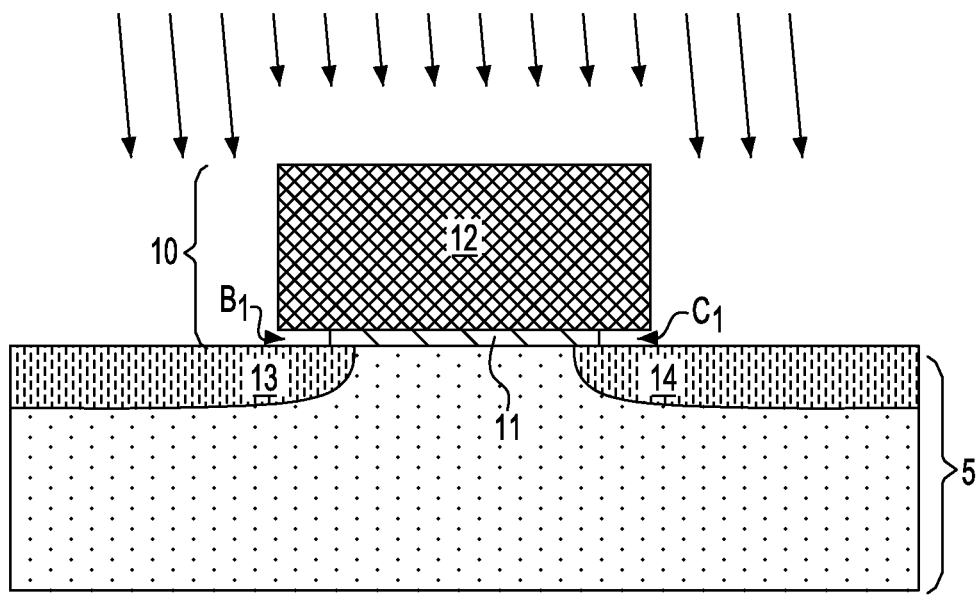
FIG. 3 is a side cross-sectional view depicting forming source and drain extension regions in the semiconductor substrate on opposing sides of the gate structure after removing the edge portions of the at least one gate dielectric, in accordance with one embodiment of the present disclosure.

FIG. 3 depicts one embodiment of forming a source extension region 13 and a drain extension region 14 in the semiconductor substrate 5 on opposing sides of the gate structure 10 after removing the edge portions of the at least one gate dielectric 11. The source extension region 13 and the drain extension region 14 may be doped with an n-type or p-type dopant. As used herein, "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to, antimony, arsenic and phosphorous. In one embodiment, the source extension region 13 and the drain extension region 14 are ion implanted into the exposed portion of the semiconductor substrate 5 that is not underlying the gate structure 10. The ion implantation step that provides the source extension region 13 and the drain extension region 14 may include a combination of normally incident and angled implants to form the desired grading in the extensions. Implant energies for forming the source extension region 13 and the drain extension region 14 may range from 1 keV to 25 keV. Ion implantation for forming the source extension region 13 and the drain extension region 14 is typically carried out using a low concentration of dopant dose ranging from $4\times10^{13}$ atoms/cm$^2$ to $1\times10^{15}$ atoms/cm$^2$. It is noted that the present disclosure is not limited to only ion implantation for forming source extension in region 13 and the drain extension region 14. For example, the source extension region 13 and the drain extension region 14 may be formed using plasma doping and gas phase diffusion.

Figure 4:
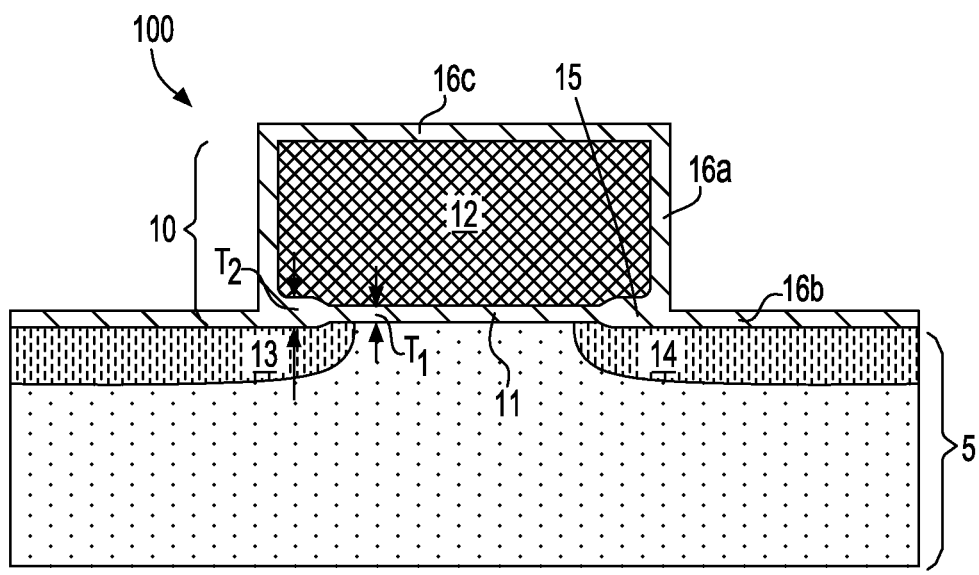
FIG. 4 is a side cross-sectional view of oxidizing the sidewall of the gate structure, wherein oxidizing the sidewall of the gate structure also oxidizes at least one of the exposed base edge of the at least one gate conductor and the exposed channel surface of the semiconductor substrate that is underlying the gate structure, in accordance with one embodiment of the present disclosure.

FIG. 4 depicts one embodiment of oxidizing the sidewall of the gate structure 10, wherein oxidizing the sidewall of the gate structure 10 also oxidizes at least one of the exposed base edges B1 of the at least one gate conductor 12 and the exposed channel surface C1 of the semiconductor substrate 5 that is underlying the gate structure 10. In one embodiment, removing the edges portions of the at least one gate dielectric 11 exposes the base edge B1 of the at least one gate conductor 12 and the channel surface C1 of the semiconductor substrate 5 so that, during sidewall oxidation of the gate structure 10, the semiconductor material of the channel surface C1 of the semiconductor substrate 5 and the base edge B1 of the at least one gate conductor 12 can be oxidized. For example, when the at least one gate conductor 12 is composed of polysilicon, and the semiconductor substrate 5 is composed of silicon, during oxidation of the sidewall of the gate structure 10, the base edge B1 of the at least one gate conductor 12 is converted to silicon oxide ($SiO_2$) and the channel surface C1 of the semiconductor substrate 5 is converted to silicon oxide ($SiO_2$). The consumption of the base edge B1 of the at least one gate conductor 12 and the channel surface C1 of the semiconductor substrate 5, e.g., oxidation of the base edge B1 of the at least one gate conductor 12 and the channel surface C1 of the semiconductor substrate 5, provides a dielectric that functions as a thickened edge portion 15 of the at least one gate dielectric 11. The combination of the dielectric formed by oxidation of the base edge B1 of the at least one gate conductor 12 and the oxidation of the channel surface Si of the semiconductor substrate 5, and the at least one gate dielectric 11 having it's original thickness T1 at the center of the gate structure 5 may be collectively referred to as a dielectric layer that is in direct contact with a surface of the semiconductor substrate 5 with edge portions 15 that have a greater thickness than a central portion of the dielectric layer. The central portion of the dielectric layer is provided by the remaining portion of the at least one gate dielectric 11.

In one embodiment, the central portion of the dielectric layer, i.e., remaining portion of the at least one gate dielectric 11, has a first thickness T1 that ranges from 2 nm to 20 nm, and the edge portion 15 of the dielectric layer has a second thickness T2 that ranges from 3 nm to 25 nm. In another embodiment, the central portion of the dielectric layer, i.e., remaining portion of the at least one gate dielectric 11, has a first thickness T1 that ranges from 5 nm to 15 nm, and the edge portion 15 of the dielectric layer has a second thickness T2 that ranges from 9 nm to 20 nm. In one embodiment, in which the base edge B1 of the at least one gate conductor 12 is provided by a semiconductor containing material, such as polysilicon, an upper portion of the thickness of the edge portion 15 of the dielectric layer extends into the at least one gate conductor 12. The lower portion of the thickness of the edge portion 15 of the dielectric layer extends into the semiconductor substrate 5. In the embodiments in which the base edge B1 of the at least one gate conductor 12 is provided by a metal, the upper portion of the thickness of the edge portion 15 of the dielectric layer does not extend into the at least one gate conductor 12. In some embodiments in which the base edge B1 of the at least one gate conductor 12 is provided by a metal, the edge portion 15 of the dielectric layer only extends into the channel surface C1 of the semiconductor substrate 5.

In addition to forming the edge portion 15 of the dielectric layer, oxidizing the sidewall of the gate structure 10 further forms a gate sidewall oxide film 16a on the sidewalls of the gate structure 10, a substrate surface oxide film 16b on the exposed surfaces of the semiconductor substrate 5, and a cap oxide film 16c on the upper surface of the gate structure 10. The gate sidewall oxide film 16a, the substrate surface oxide film 16b and the cap oxide film 16c may each be composed of silicon oxide ($SiO_2$). The gate sidewall oxide film 16a, the substrate surface oxide film 16b and the cap oxide film 16c may each have a thickness of from 1 nm to 20 nm. In one embodiment, the gate sidewall oxide film 16a, the substrate surface oxide film 16b and the cap oxide film 16c may each have a thickness of from 2 nm to 10 nm.

The conditions used in forming edge portion 15 of the dielectric layer, the gate sidewall oxide film 16a, the substrate surface oxide film 16b, and the cap oxide film 16c may vary depending upon the sidewall oxidation process performed. In one embodiment, the edge portion 15 of the dielectric layer, the gate sidewall oxide film 16a, the substrate surface oxide film 16b, and the cap oxide film 16c may be formed using thermal oxidation. For example, thermal oxidation may be carried out at a temperature ranging from 800° C. to 1100° C. for a time period of from 10 seconds to 2 hours in an oxygen containing ambient. In one embodiment, the ambient for thermal oxidation employed includes an oxygen-containing gas, such as $O_2$, air, ozone, NO, $NO_2$ and other like oxygen-containing gases. Mixtures of the aforementioned oxygen-containing gases are also contemplated herein. The oxygen-containing gas may be used alone, or it may be admixed with an inert gas such as He, Ar, $N_2$, Kr, Xe or mixtures thereof. Annealing for thermal oxidation may include furnace annealing, rapid thermal annealing and combinations thereof.

In one embodiment, the sidewall oxidation step is carried out in an oxidizing ambient that comprises atomic oxygen. Atomic oxygen radicals can oxidize silicon surfaces. Atomic oxygen can be formed by utilizing a free-radical enhanced rapid thermal oxidation (FRE RTO) process, by employing remote formation of gaseous discharges (plasma) in oxygen-bearing gases, or by decomposing unstable oxygen-bearing gases, such as ozone. In one embodiment, in the FRE RTO process, hydrogen and oxygen are introduced into a process chamber and held at a low pressure of between 50 Torr and 0.1 Torr. The oxygen and hydrogen react in the volume of the chamber and at a silicon surface producing highly reactive oxygen radicals that rapidly oxidize silicon. The FRE RTO process is also known in the art under the name of an In-Situ Steam Generation (ISSG) process.

In another embodiment, a plasma-assisted oxidation is employed to form the edge portion 15 of the dielectric layer, the gate sidewall oxide film 16a, the substrate surface oxide film 16b, and the cap oxide film 16c. In this process, a remote gaseous discharge is used to break oxygen-bearing molecules. At a low pressure, the atomic oxygen produced in the discharge zone can be transported to the processing zone almost without loss. This is again due to a very low volume recombination of atomic oxygen at low pressures. Accordingly, in one example, the process is conducted at a low chamber pressure of below 50 Torr. The preferred pressure range of the discharge zone is from about 1 mTorr to about 10 Torr. The process can be conducted at the substrate temperature of from about room-temperature (e.g., 25° C.) to about 1100° C. The steps of removing the edge portion of the at least one gate dielectric on each side of the gate structure and the oxidizing of the sidewall of the gate structure may be repeated.

In yet another embodiment, the above noted oxidation step may be substituted with a thermal nitridation step. In this embodiment, the sidewall of the gate structure 10 is nitrided, as well as at least one of the exposed base edges B1 of the at least one gate conductor 12 and the exposed channel surface C1 of the semiconductor substrate 5 that is underlying the gate structure 10. The consumption of the base edge B1 of the at least one gate conductor 12 and the channel surface C1 of the semiconductor substrate 5, e.g., nitridation of the base edge B1 of the at least one gate conductor 12 and the channel surface C1 of the semiconductor substrate 5, provides a dielectric that functions as a thickened edge portion 15 of the at least one gate dielectric 11. In one embodiment, the nitridation process of the present invention is carried out in a nitrogen-containing ambient, such as NO, $N_2$, $N_2O$, $NH_3$ or any combination thereof. In some embodiments, the nitridation process may be mixed with an inert gas such as He, Ar, Ne, Xe, Kr and mixtures thereof. When an admixture of nitrogen-containing ambient and inert gas is employed, the admixture may comprise from about 1 to about 100 weight % nitrogen-containing ambient, and from 0 weight % to 99 weight % inert gas. In one embodiment, a mixture of a nitrogen-containing ambient and inert gas is employed, in which the admixture comprises from 5 weight % to 100 weight % nitrogen-containing ambient, and from 0 weight % to 95 weight % inert gas. In one example, $N_2$ is employed as the nitrogen-containing ambient. The thermal nitridation process may be performed at temperatures of 700° C. or greater. In some embodiments, the thermal nitridation process may be performed at temperatures ranging from 750° C. to 850° C. In the embodiments, in which thermal nitridation is substituted for oxidation, the thickened edge portion 15 of the at least one gate dielectric 11 is composed of a nitride, such as silicon nitride.

Figure 5:
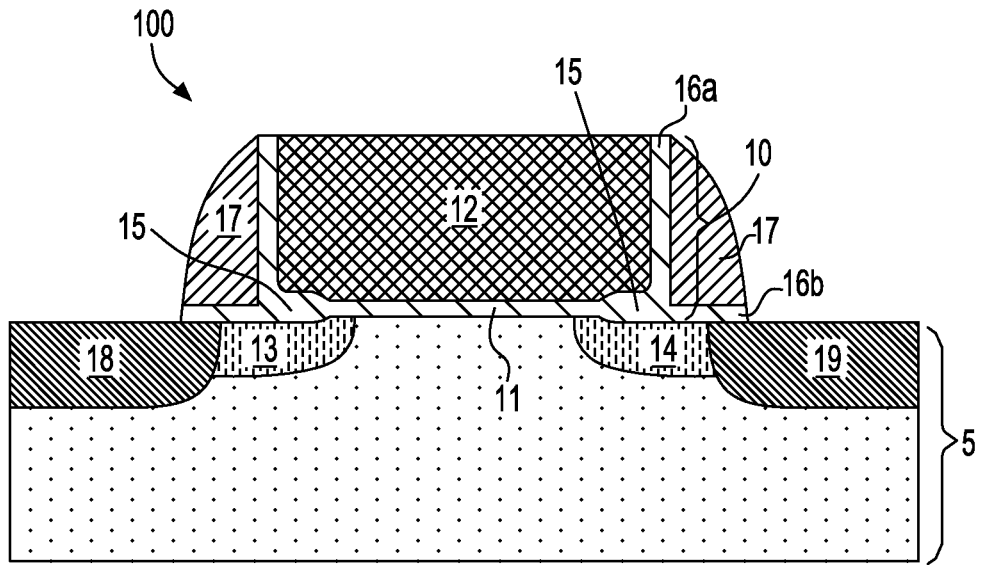
FIG. 5 is a side cross-sectional view of forming spacers adjacent to the gate structure and implanting a deep source region and a deep drain region in the semiconductor substrate on opposing sides of the gate structure, in accordance with one embodiment of the present disclosure.

FIG. 5 depicts one embodiment of forming spacers 17 adjacent to the gate structure 10 and implanting a deep source region 18 and deep drain region 19 in the semiconductor substrate 5 on opposing sides of the gate structure 10. In one embodiment, the spacer 17 may be composed of silicon nitride, e.g., $Si_3N_4$, but may also comprise an oxynitride material. The spacer 17 may be formed by deposition and etch processes. For example, a conformal nitride containing layer may be deposited using conventional deposition processes, including, but not limited to, chemical vapor deposition (CVD), plasma-assisted CVD, and low-pressure chemical vapor deposition (LPCVD). Following deposition, the conformal nitride containing layer is then etched using an anisotropic etch, such as reactive ion etch (RIE). In some embodiments, the etch process that forms the spacer 17 may also remove the cap oxide film 16c and the substrate surface oxide film 16b that is not adjacent to the gate structure 10. In one embodiment, the spacer 17 may have a width ranging from 2.0 nm to 15.0 nm.

Referring to FIG. 5, a deep source region 18 and a deep drain region 19 may be implanted into the semiconductor substrate 5 after forming the spacer 17. The conductivity type of the deep source region 18 and the deep drain region 19 is typically the same as the conductivity type as the source extension region 13 and the drain extension region 14. The combination of the source extension region 13 and the deep source region 18 provide the source region of the semiconductor device, and the combination of the drain extension region 14 and the deep drain region 19 provide the drain region of the semiconductor device. As used herein, the term "source" is a doped region in the semiconductor device, in which majority carriers are flowing into the channel. As used herein, the term "drain" means a doped region in semiconductor device located at the end of the channel, in which carriers are flowing out of the transistor through the drain. The conductivity of the source and drain regions typically dictate the conductivity type of the semiconductor device. For example, a semiconductor device having n-type source and drain regions is typically referred to as an n-type semiconductor device.

In some embodiments, the deep source region 18 and the deep drain region 19 may be formed using an ion implantation method similar to the method for forming the source extension region 13 and the drain extension region 14, with the exception that the implant for the deep source region 18 and the deep drain region 19 typically employs a higher implant energy and greater implant dose than the implantation process for forming the source extension region 13 and the drain extension region 14. In one example, an n-type deep source region 18 and an n-type deep drain region 19 may be implanted with phosphorus using an energy ranging from 3.0 keV to 25.0 keV with a dose of $1 \times 10^{15}$ atoms/cm$^2$ to $7 \times 10^{15}$ atoms/cm$^2$. In one example, a p-type deep source region 18 and an n-type deep drain region 19 may be implanted with boron using an energy ranging from 1.0 keV to 8.0 keV with a dose of $1 \times 10^{15}$ atoms/cm$^2$ to $7 \times 10^{15}$ atoms/cm$^2$.

In one embodiment, the source and drain regions, e.g., source extension region 13, drain extension region 14, deep source region 18 and deep drain region 19, may be activated using a thermal anneal. The anneal process may be provided by thermal anneal, such as a furnace anneal, rapid thermal anneal, spike anneal or laser anneal. In one example, the temperature of the anneal process to activate the dopant of the source and drain regions ranges from 700° C. to 1100° C. In another examples, the temperature of the anneal process to activate the dopant of the source and drain region ranges from 800° C. to 1000° C. The time period of the anneal process to activate the dopant of the source and drain regions may range from 1 second to 60 seconds. In another embodiment, the time period of the anneal process to activate the dopant of the source and drain regions ranges from 5 seconds to 30 seconds.

FIG. 5 depicts one embodiment of a semiconductor device 100 that includes a gate structure 10 on a semiconductor substrate 5, in which the gate structure 10 includes at least one gate conductor 12 and at least one gate dielectric 11. The at least one gate dielectric 11 includes a dielectric layer that is in direct contact with a surface of the semiconductor substrate 5, in which a central portion of the dielectric layer has a first thickness T1 and the edge portions 15 of the dielectric layer have a second thickness T2, wherein the second thickness T2 is greater than the first thickness T1. A source region, i.e., source extension region 13 and deep source region 18, and a drain region, i.e., drain extension region 14 and deep drain region 19, is present in the semiconductor substrate 5 on opposing sides of the gate structure 10. The central portion of the dielectric layer having the first thickness T1 dictates the threshold voltage of the semiconductor device 100. As used herein, "threshold voltage" is the lowest attainable gate voltage that will turn on a semiconductor device, e.g., transistor, by making the channel of the device conductive. The edge portions 15 of the dielectric layer having the second thickness T2 reduces gate induced drain leakage and hot carrier injection in the semiconductor device 100 in comparison to a similarly structured semiconductor device having a uniform thickness gate dielectric with a thickness equal to the thickness of the dielectric layer at the central portion, i.e., first thickness T1.

FIGS. 1-5 depict only one process sequence for forming a semiconductor device 100 in accordance with the present disclosure. It is not intended that the methods and structures disclosed herein be limited to only the process sequence depicted in FIGS. 1-5. For example, although FIGS. 1-5 depict removing the edge portions of the at least one gate dielectric 11 before forming the source extension region 13 and the drain extension region 14, embodiments of the present disclosure have been contemplated in which the source extension region 13 and the drain extension region 14 are formed prior to removing the edge portions of the at least one gate dielectric 11.

Figure 6:
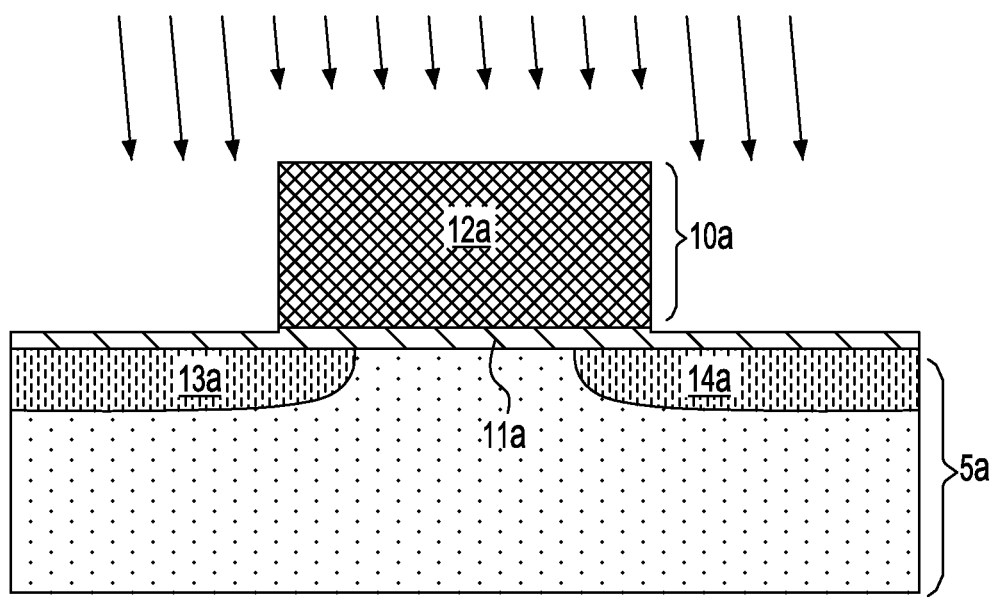
FIG. 6 is a side cross-sectional view depicting forming a source extension region and a drain extension region in the semiconductor substrate on opposing sides of the gate structure before removing the edge portions of the at least one gate dielectric from each side of the gate structure, in accordance with another embodiment of the present disclosure.

FIG. 6 depicts one embodiment of forming a source extension region 13a and a drain extension region 14a in the semiconductor substrate 5a on opposing sides of the gate structure 10a before removing the edge portions of the at least one gate dielectric 11a from each side of the gate structure 10a.

The semiconductor substrate 5a and gate structure 10a (including the at least one gate dielectric 11a and the at least one gate conductor 12a) that are depicted in FIG. 6 are similar to the semiconductor substrate 5 and gate structure 10 (including the at least one gate dielectric 11 and the at least one gate conductor 12) that are depicted in FIG. 1. Therefore, the above description of the semiconductor substrate 5 and gate structure 10 that are depicted in FIG. 1 is suitable for the semiconductor substrate 5a and gate structure 10a that are depicted in FIG. 6. The source extension region 13a and the drain extension region 14a that are depicted in FIG. 6 may be formed using the methods for forming the source extension region 13 and the drain extension region that are described above with reference to FIG. 3.

Figure 7:
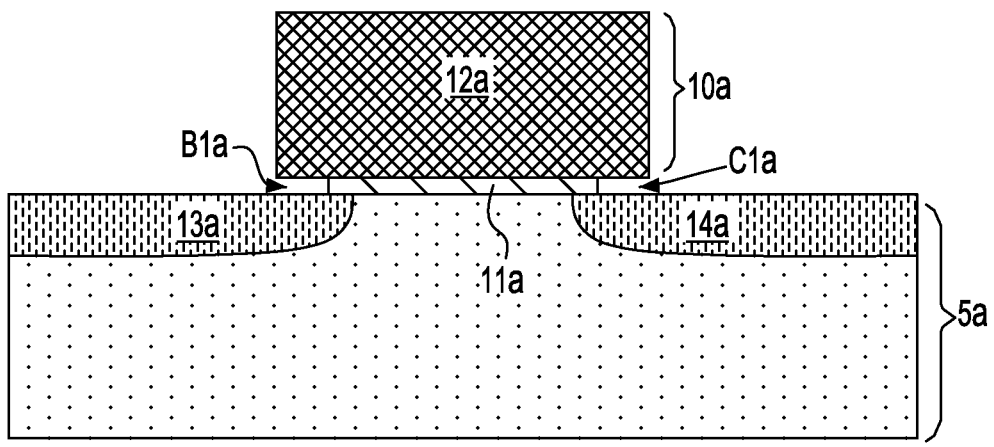
FIG. 7 is a side cross-sectional view depicting removing the edge portions of the at least one gate dielectric from each side of the gate structure that is depicted in FIG. 6.

FIG. 7 depicts one embodiment of removing the edge portions of the at least one gate dielectric 11a from each side of the gate structure 10a that is depicted in FIG. 6. The method for removing the edge portions of the at least one gate dielectric 11 that is described above with reference to FIG. 2 is suitable for removing the edge portions of the at least one gate dielectric 11a that is depicted in FIG. 7. Following removal of the edge portions of the at least one gate dielectric 11a, the structure depicted in FIG. 7 may be treated by the process sequence that is described above with reference to FIGS. 4 and 5 to provide a semiconductor device including at least one gate dielectric with a dielectric layer that is in direct contact with a surface of the semiconductor substrate, in which a central portion of the dielectric layer has a first thickness and the edge portions of the dielectric layer have a second thickness, wherein the second thickness is greater than the first thickness. To summarize, following removing the edge portions of the at least one gate dielectric 11a, the sidewalls of the gate structure 10a that is depicted in FIG. 7 are oxidized, as well as the exposed base edge B1a of the at least one gate conductor 12a and the exposed channel surface C1a of the semiconductor substrate 5a that is underlying the gate structure 10a, using methods similar to those described above with reference to FIG. 4. Thereafter, at least one spacer is formed adjacent to the gate structure and deep source and drain regions are formed in the semiconductor substrate on opposing sides of the gate structure 10 using methods similar to those described above with reference to FIG. 5.

Figure 8:
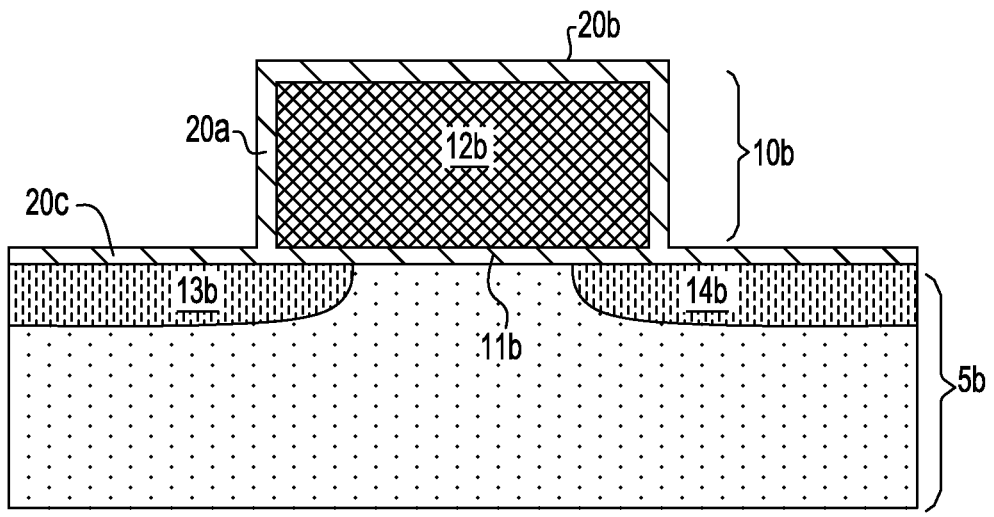
FIG. 8 is a side cross-sectional view depicting a preliminary sidewall oxidation process applied to a gate structure before removing the edge portions of the at least one gate dielectric from each side of the gate structure, in accordance with another embodiment of the present disclosure.

In yet another embodiment of the present disclosure, the gate structure may be treated with a preliminary sidewall oxidation prior to forming the source extension region and the drain extension region, and prior to removing the edge portions of the at least one gate dielectric of the gate structure. FIG. 8 depicts one embodiment of a gate structure 10b that has been treated with a preliminary sidewall oxidation, wherein the preliminary sidewall oxidation forms a sidewall preliminary oxide film 20a on the sidewall of the gate structure 10b, a cap preliminary oxide film 20b on the upper surface of the gate structure 10b, and a substrate preliminary oxide film 20c on the semiconductor substrate 5b. The semiconductor substrate 5b and gate structure 10b (including the at least one gate dielectric 11b and the at least one gate conductor 12b) that are depicted in FIG. 8 are similar to the semiconductor substrate 5 and gate structure 10 (including the at least one gate dielectric 11 and the at least one gate conductor 12) that are depicted in FIG. 1. Therefore, the above description of the semiconductor substrate 5 and gate structure 10 that are depicted in FIG. 1 is suitable for the semiconductor substrate 5b and gate structure 10b that are depicted in FIG. 8. The preliminary sidewall oxidation that forms the sidewall preliminary oxide film 20a on the sidewall of the gate structure 10b, the cap preliminary oxide film 20b on the upper surface of the gate structure 10b, and the substrate preliminary oxide film 20c on the semiconductor substrate 5b is similar to the gate sidewall oxidation procedures that are described above with reference to FIG. 4. In one embodiment, the preliminary sidewall oxidation protects the gate structure 10b from contamination. In one example, the sidewall preliminary oxide film 20a, the cap preliminary oxide film 20b and the substrate preliminary oxide film 20c are each composed of silicon oxide ($SiO_2$).

Figure 9:
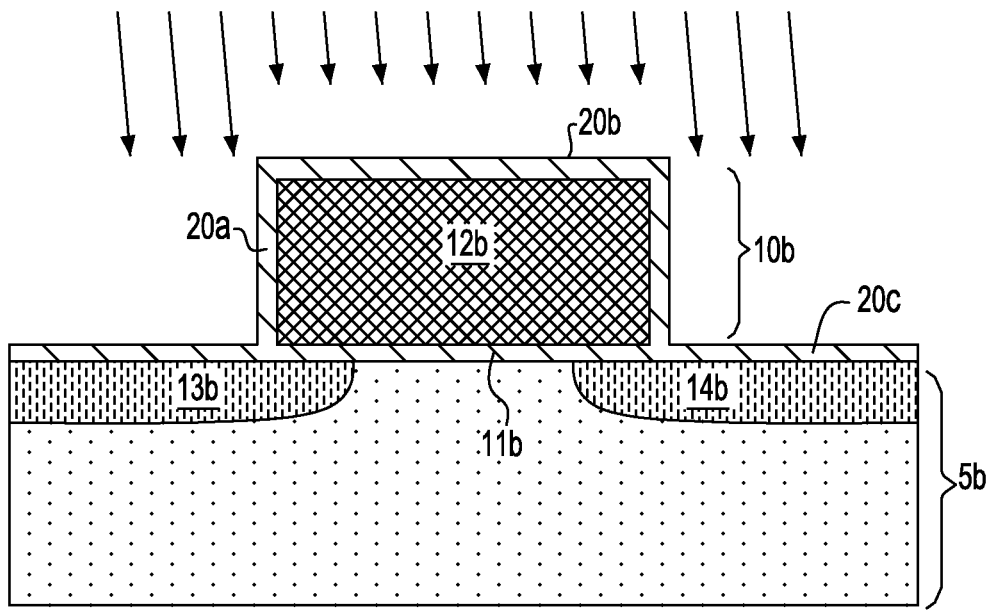
FIG. 9 is a side cross-sectional view depicting forming source and drain extension regions in the semiconductor substrate on opposing sides of the gate structure depicted in FIG. 8.

FIG. 9 depicts one embodiment of forming a source extension region 13b and a drain extension region 14b in the semiconductor substrate 5b on opposing sides of the gate structure 10b that is depicted in FIG. 8. The source extension region 13b and the drain extension region 14b that are depicted in FIG. 9 may be formed using the methods for forming the source extension region 13 and the drain extension region 14 that are described above with reference to FIG. 3. In one embodiment, the sidewall preliminary oxide film 20a, the cap preliminary oxide film 20b and the substrate preliminary oxide film 20c are present during the processing to form the source extension region 13b and the drain extension region 14b.

Figure 10:
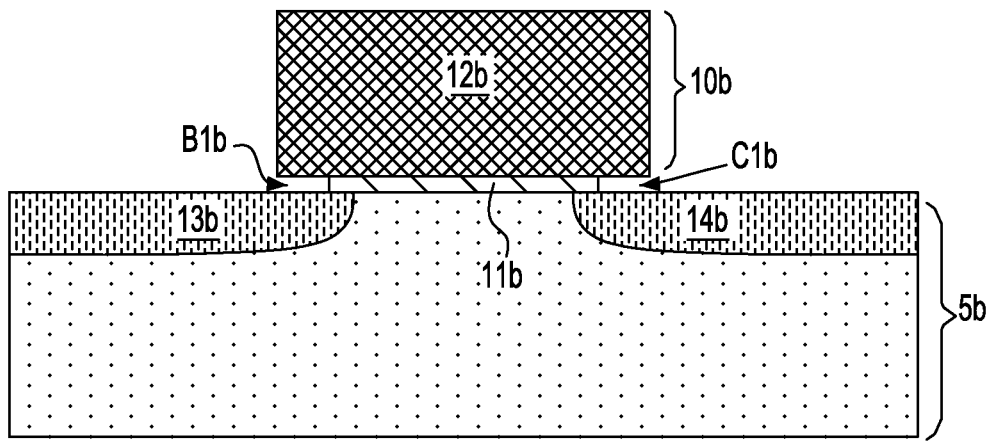
FIG. 10 is a side cross-sectional view depicting one embodiment of removing the edge portions of the at least one gate dielectric from each side of the gate structure depicted in FIG. 9.

FIG. 10 depicts one embodiment of removing the edge portions of the at least one gate dielectric 11b from each side of the gate structure 10b that is depicted in FIG. 9. The method for removing the edge portions of the at least one gate dielectric 11 that is described above with reference to FIG. 2 is suitable for removing the edge portions of the at least one gate dielectric 11b that is depicted in FIG. 10. In one embodiment, the etch process that removes the edge portions of the at least one gate dielectric 11b also removes at least one of the sidewall preliminary oxide film 20a, the cap preliminary oxide film 20b and the substrate preliminary oxide film 20c, as depicted in FIG. 10.

Following removal of the edge portions of the at least one gate dielectric 11b, the structure depicted in FIG. 10 may be treated by the process sequence that is described above with reference to FIGS. 4 and 5 to provide a semiconductor device including at least one gate dielectric with a dielectric layer that is in direct contact with a surface of the semiconductor substrate, in which a central portion of the dielectric layer has a first thickness and the edge portions of the dielectric layer have a second thickness, wherein the second thickness is greater than the first thickness. To summarize, following removing the edge portions of the at least one gate dielectric 11b, the sidewalls of the gate structure 10b that is depicted in FIG. 7 are oxidized, as well as the exposed base edge B1b of the at least one gate conductor 12b and the exposed channel surface C1b of the semiconductor substrate 5 that is underlying the gate structure 10b, using methods similar to those described above with reference to FIG. 4. Thereafter, at least one spacer is formed adjacent to the gate structure and deep source and drain regions are formed in the semiconductor substrate on opposing sides of the gate structure using methods similar to those described above with reference to FIG. 5.

While the present disclosure has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor device comprising:
   a gate structure on a semiconductor substrate, wherein said gate structure comprises at least one gate conductor and at least one gate dielectric, wherein the at least one gate dielectric comprises a dielectric layer having a bottommost surface in direct contact with a surface of the semiconductor substrate and a topmost surface in direct contact with said at least one gate conductor, wherein said dielectric layer has edge portions that have a greater thickness than a central portion of said dielectric layer, wherein a lower surface of the edge portions extends into the semiconductor substrate;
   a gate sidewall oxide film on the sidewalls of the gate structure;
   a substrate surface oxide film adjacent to said gate structure, wherein said substrate surface oxide film is in direct contact with an uppermost surface of said semiconductor substrate;
   a spacer on opposing sides of said gate structure, wherein an inner sidewall of said spacer is in direct contact with an outermost surface of said gate sidewall oxide film and a bottommost surface of said spacer is in direct contact with an uppermost surface of said substrate surface oxide film, wherein said substrate surface oxide film does not extend beyond the outermost portion of said spacer; and
   a source region and a drain region in the semiconductor substrate on opposing sides of the gate structure.

2. The semiconductor device of claim 1, wherein the dielectric layer comprises a high-k dielectric material.

3. The semiconductor device of claim 1, wherein the central portion of the dielectric layer has a first thickness that ranges from 2 nm to 20 nm, and the edge portions of the dielectric layer have a second thickness that ranges from 3 nm to 25 nm.

4. The semiconductor device of claim 3, wherein an upper surface of the first thickness of each edge portion of the dielectric layer is planar.

5. The semiconductor device of claim 1, wherein said edge portions of the dielectric layer have a length of 2 nm to 25 nm, as measured from an outer sidewall of the at least one gate conductor.

6. The semiconductor device of claim 1, wherein the central portion of the dielectric layer dictates the threshold voltage of the semiconductor device, and the edge portions of the dielectric layer reduce gate induced drain leakage and hot carrier injection in the semiconductor device in comparison to a similarly structured semiconductor device having a uniform thickness gate dielectric with a thickness equal to the thickness of the dielectric layer at the central portion.

7. The semiconductor device of claim 1, wherein said semiconductor substrate comprises a silicon containing material.

8. The semiconductor device of claim 7, wherein said silicon containing material is selected from the group consisting of Si, SiGe, carbon doped silicon, and combinations thereof.

9. The semiconductor device of claim 1, wherein the gate structure further comprises a dielectric gate cap on an upper surface of said at least one gate conductor.

10. The semiconductor device of claim 1, wherein an upper portion of said edge portions of the dielectric layer extends into said at least one gate conductor.

11. The semiconductor device of claim 1, wherein said at least one gate conductor is comprised of a material selected from the group consisting of a semiconductor containing material, a metal or a combination thereof.

12. The semiconductor device of claim 11, wherein said at least one gate conductor is comprised of a metal, and an upper portion of the edge portions of the dielectric layer does not extend into the at least one gate conductor.

13. The semiconductor device of claim 1, wherein said source and said drain region comprise a source and a drain extension region and a deep source region and a deep drain region.

14. The semiconductor device of claim 1, wherein said spacer is comprised of silicon nitride, oxynitride or a combination thereof.

15. The semiconductor device of claim 1, wherein said spacer has a width of 2.0 nm to 15 nm.

* * * * *